(12) United States Patent
Hakomori

(10) Patent No.: US 8,427,842 B2
(45) Date of Patent: Apr. 23, 2013

(54) COMMUNICATION MODULE

(75) Inventor: Katsuhiko Hakomori, Kawasaki (JP)

(73) Assignee: Fujitsu Optical Components Limited, Kawasaki (JP)

( * ) Notice: Subject to any disclaimer, the term of this patent is extended or adjusted under 35 U.S.C. 154(b) by 48 days.

(21) Appl. No.: 13/137,831

(22) Filed: Sep. 15, 2011

(65) Prior Publication Data
US 2012/0008303 A1 Jan. 12, 2012

Related U.S. Application Data

(63) Continuation of application No. PCT/JP2009/056546, filed on Mar. 30, 2009.

(51) Int. Cl.
*H05K 7/14* (2006.01)
*H05K 9/00* (2006.01)

(52) U.S. Cl.
USPC ........... 361/799; 361/816; 361/818; 361/727; 361/737; 439/76.1; 439/76.2; 277/301; 277/646

(58) Field of Classification Search .................. None
See application file for complete search history.

(56) References Cited

U.S. PATENT DOCUMENTS

| | | | | |
|---|---|---|---|---|
| 4,100,798 | A * | 7/1978 | Nilsson et al. | 73/861.52 |
| 4,620,124 | A * | 10/1986 | Farrall et al. | 310/332 |
| 6,078,229 | A * | 6/2000 | Funada et al. | 333/193 |
| 6,437,989 | B1 * | 8/2002 | Lopatin et al. | 361/760 |
| 6,456,168 | B1 * | 9/2002 | Luff | 331/68 |
| 6,466,453 | B2 * | 10/2002 | Kobayashi | 361/818 |
| 6,702,301 | B1 * | 3/2004 | Davies et al. | 277/646 |
| 7,322,752 | B2 * | 1/2008 | Endou et al. | 385/92 |
| 7,444,209 | B2 * | 10/2008 | Damien | 700/300 |
| 2005/0198907 | A1 * | 9/2005 | McKnight et al. | 49/475.1 |
| 2007/0019349 | A1 * | 1/2007 | Daio et al. | 361/91.1 |
| 2007/0059953 | A1 * | 3/2007 | Togami et al. | 439/76.1 |
| 2008/0232758 | A1 * | 9/2008 | Miyoshi et al. | 385/136 |
| 2009/0247010 | A1 * | 10/2009 | Hartzell et al. | 439/595 |
| 2010/0061577 | A1 * | 3/2010 | Yeates et al. | 381/337 |
| 2010/0072706 | A1 * | 3/2010 | Schmitz et al. | 277/301 |

FOREIGN PATENT DOCUMENTS

| | | |
|---|---|---|
| JP | 5-20014 | 3/1993 |
| JP | 5-251595 | 9/1993 |
| JP | 2004-355731 | 12/2004 |

(Continued)

OTHER PUBLICATIONS

International Search Report for PCT/JP2009/056546, mailed May 19, 2009.

(Continued)

*Primary Examiner* — Adrian S Wilson
*Assistant Examiner* — Abhishek Rathod
(74) *Attorney, Agent, or Firm* — Staas & Halsey LLP

(57) ABSTRACT

An electromagnetic wave suppression material is fixed to a case of a communication module. The electromagnetic wave suppression material suppresses radiation of electromagnetic waves by coming into contact with a cage that is a module insertion portion of a chassis when the communication module is inserted into the cage. A piezoelectric element is provided on the case, and located between the case and the electromagnetic wave suppression material. When the communication module is inserted into the cage, the controller applies a voltage to the piezoelectric element to stretch it by the applied voltage, thereby increasing contact pressure between the cage and the electromagnetic wave suppression material.

5 Claims, 17 Drawing Sheets

FOREIGN PATENT DOCUMENTS

| | | |
|---|---|---|
| JP | 2006-106680 | 4/2006 |
| JP | 2006-352024 | 12/2006 |
| JP | 2007-242653 | 9/2007 |
| JP | 2008-233645 | 10/2008 |

OTHER PUBLICATIONS

Patent Abstracts of Japan, Publication No. 2008-233645, Published Oct. 2, 2008.

Patent Abstracts of Japan, Publication No. 2007-242653, Published Sep. 20, 2007.

Patent Abstracts of Japan, Publication No. 5-251595, Published Sep. 28, 1993.

Patent Abstracts of Japan, Publication No. 2006-352024, Published Dec. 28, 2006.

Patent Abstracts of Japan, Publication No. 2004-355731, Published Dec. 16, 2004.

Patent Abstracts of Japan, Publication No. 2006-106680, Published Apr. 20, 2006.

\* cited by examiner

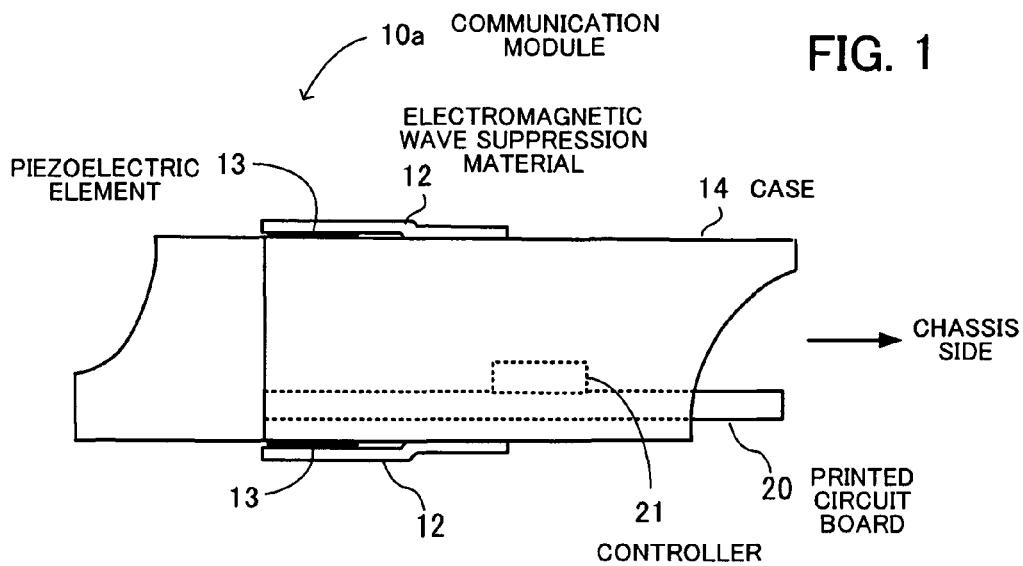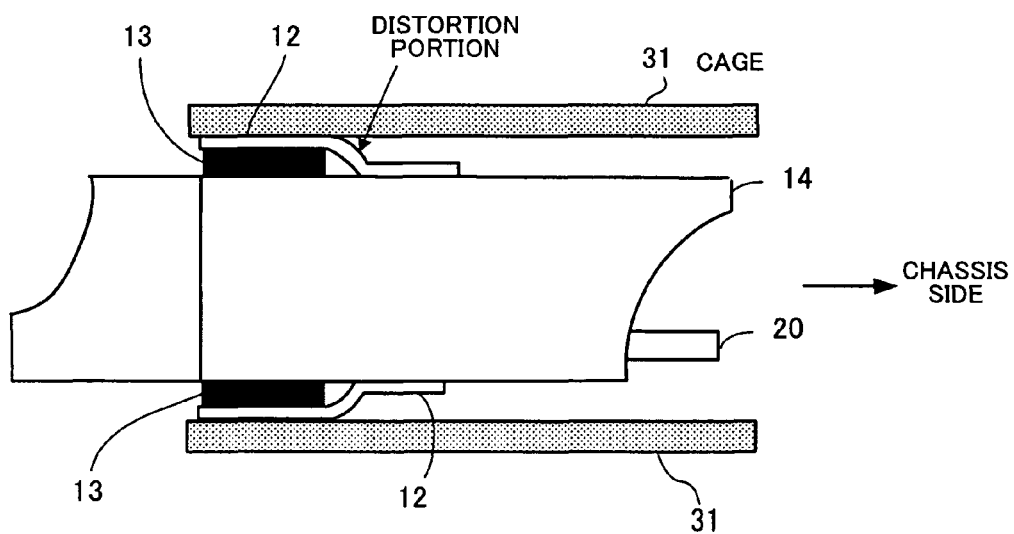
FIG. 1

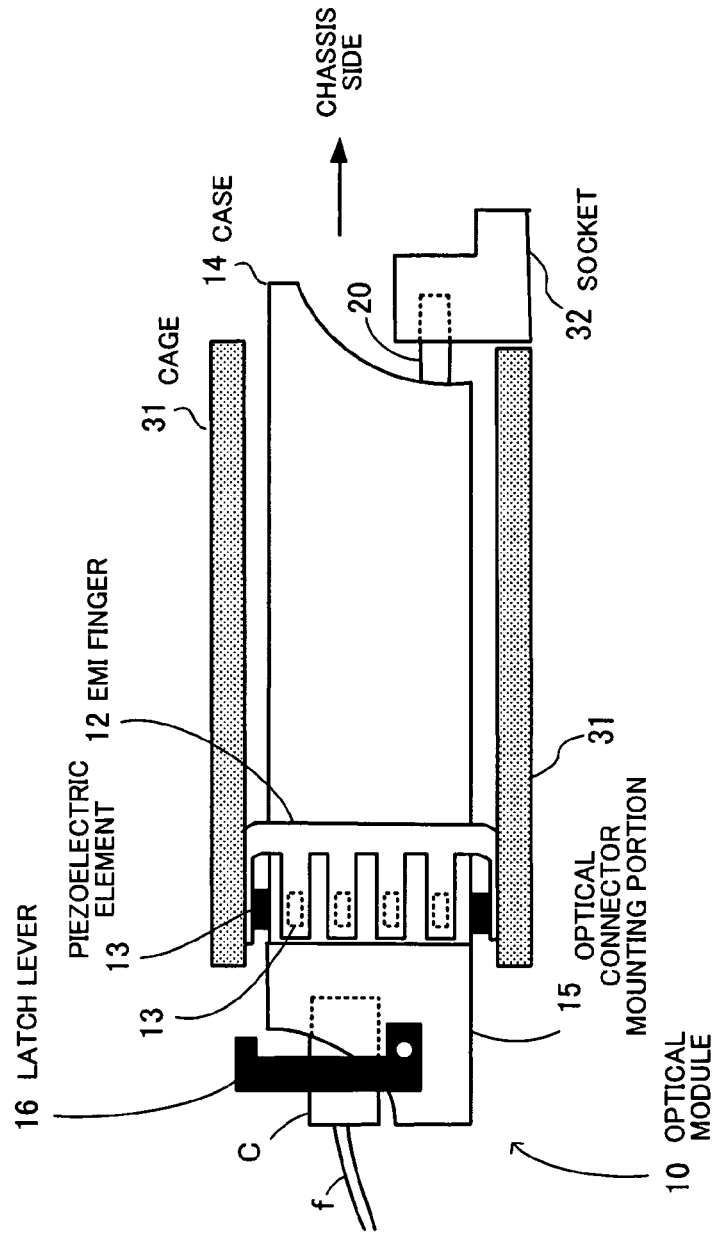

INSERTION STATE

EXTRACTION STATE

COMMUNICATION MODULE

This application is a continuing application, filed under 35 U.S.C. §111(a), of International Application PCT/JP2009/056546, filed on Mar. 30, 2009.

FIELD

The embodiment discussed herein is related to a communication module having a suppression mechanism for electromagnetic interference (EMI).

BACKGROUND

In recent years, as functional sophistication, miniaturization and weight reduction of electronic devices progress, speeding up of circuits and a high density of part mounting have further advanced. Countermeasures against EMI resulted from these trends are more emphasized. EMI means electromagnetic interference, i.e., a phenomenon that electromagnetic waves emitted by electronic devices interference with operations of peripheral electronic devices.

In general EMI countermeasures, EMI shielding components are fixed onto a portion which radiates unnecessary electromagnetic waves, so as to absorb electromagnetic wave noise, thereby suppressing radiation. In an optical module having a light emitting function and a light receiving function of signal light, used for optical fiber communication, for example, shielding components being a metallic elastic body referred to as an EMI finger are wound around itself. By inserting an optical module having an EMI finger wound thereon into a chassis, leakage of unnecessary electromagnetic waves is prevented in optical communication.

FIG. 16 illustrates an optical module having an EMI finger wound thereon. The illustrated optical module 50 is configured by a printed circuit board 51 on which a light emitting element and a light receiving element are mounted and a case 52 that covers the printed circuit board 51. Around the case 52, the EMI finger 6 being a metallic spring material is fixedly wound.

FIG. 17 illustrates a state in which the optical module 50 is inserted into a chassis. Specifically, the optical module 50 is inserted into an insertion opening referred to as a cage 31 provided on the chassis. Further, in the case where the optical module 50 performs optical transmission and reception, an optical connector C connected to an optical fiber f is inserted into the optical module 50.

Here, when the optical module 50 is inserted into the cage 31 and performs optical transmission or optical reception, unnecessary electromagnetic waves may be radiated from a gap between the cage 31 and the case 52 of the optical module 50.

Accordingly, for suppressing radiation of such unnecessary electromagnetic waves, the EMI finger 6 is wound around a predetermined portion of the optical module 50 so as to come in contact with a leading edge side of the cage 31. At the time when the optical module 50 having the EMI finger 6 wound thereon is inserted into the cage 31, and the EMI finger 6 comes in contact with the cage 31, external radiation of unnecessary electromagnetic waves is suppressed.

As a conventional technology, in Japanese Laid-open Patent Publication No. 2006-106680, the following technology is disclosed. That is, the sleeve of the tip section of a light-emitting element module or a light-receiving element module is made of ceramics, and a holder and an adaptor are made of metals. As a result, the EMI is suppressed. Also, in Japanese Utility Model Application Publication No. 05-20014, disclosed is a technology in which applied voltage of a piezoelectric element is controlled to adjust an optical axis.

As described above, the EMI finger 6 being an electromagnetic wave shielding material is heretofore fixed around the optical module 50. The EMI finger 6 of the optical module 50, when inserted in the chassis, comes into contact with the cage 31 of the chassis, thereby preventing the radiation of electromagnetic waves.

However, when repeating the insertion/extraction of the optical module 50, the EMI finger 6 undergoes plastic deformation (deformation in which the EMI finger 6 gets deformed by external force, and its shape fails to return to original even after the force is removed), so that a contact between the EMI finger 6 and the cage 31 is degraded in some cases. There arises a problem that when the contact between the cage 31 and the EMI finger 6 is degraded, unnecessary electromagnetic waves are radiated from a leading periphery of the cage 31, and as a result, the EMI increases.

For the purpose of correcting the above-described plastic deformation of the EMI finger 6, which occurs across the ages, countermeasures of increasing spring pressure (elastic constant) of the EMI finger 6 to prevent the plastic deformation from easily occurring, and increase a contact pressure (contact friction) are considered to be adopted.

However, an optical module must be pursuant to specifications referred to as multi source agreement (MSA) in which mechanism and electrical specifications are specified. With regard to an insertion/extraction force of the optical module, specifications of the insertion/extraction force specified in the MSA must be satisfied. Therefore, countermeasures of increasing spring pressure of the EMI finger 6 to increase the contact pressure between the optical module and the cage 31 cannot be simply adopted.

SUMMARY

According to one aspect of the present invention, this communication module includes a case to cover an internal component of the module capable of being inserted into/extracted from a chassis, an electromagnetic wave suppression material provided on a surface of the case to contact with a cage to suppress radiation of an electromagnetic wave at the time of inserting the module into the cage being a module insertion portion of the chassis, a piezoelectric element provided between the case and the electromagnetic wave suppression material; and a controller to perform voltage control to the piezoelectric element, wherein when the module is inserted into the cage, the controller controls the piezoelectric element to apply pressure to the electromagnetic wave suppression material to increase contact pressure between the cage and the electromagnetic wave suppression material.

The object and advantages of the invention will be realized and attained by means of the devices and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 illustrates a configuration example of a communication module;

FIG. 4 illustrates a state in which the optical module is inserted into a chassis;

DESCRIPTION OF EMBODIMENTS

Figure 2:
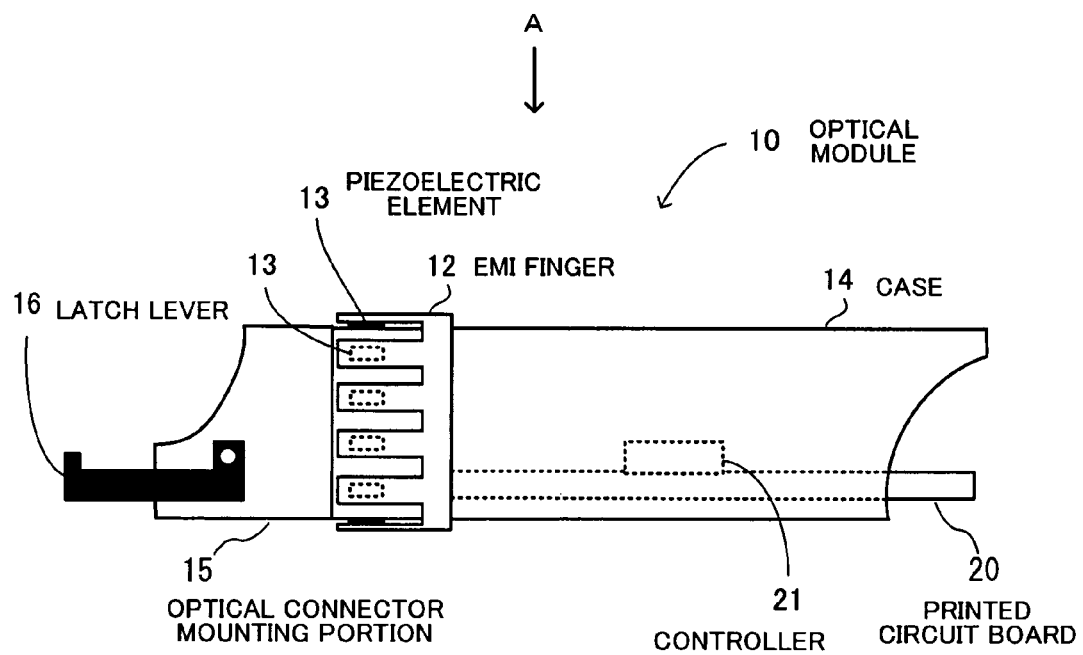
FIG. 2 illustrates an optical module having an EMI finger wound thereon.

A preferred embodiment of the present invention will be described below with reference to the accompanying drawings. FIG. 1 illustrates a configuration example of a communication module. The illustrated communication module 10a includes a printed circuit board 20, an electromagnetic wave suppression material 12, two or more piezoelectric elements 13, and a case 14, and is a plug-in insertable/extractable pluggable type module.

The case 14 of the communication module 10a covers the printed circuit board 20. On the printed circuit board 20, various electronic components for performing communication and a controller 21 that performs voltage control to the piezoelectric elements 13 are mounted. The electromagnetic wave suppression material 12 is fixed on an external surface of the case 14, and it is an elastic member that suppresses radiation of electromagnetic wave by coming in contact with a cage 31 when the communication module 10a is inserted into the cage 31 being a module insertion portion of a chassis.

The piezoelectric element 13 is an element that uses a piezoelectric effect (a phenomenon in which a charge proportional to an applied pressure occurs, or a phenomenon in which when an electric field is applied, a piezoelectric substance itself is transformed). The piezoelectric element 13 is fixed on an external surface of the case 14, and is located between the case 14 and the electromagnetic wave suppression material 12. The piezoelectric element 13 here used stretches the element itself by an applied voltage.

Here, when the communication module 10a is inserted into the cage 31, the controller 21 applies a voltage to the piezoelectric element 13, and stretches the element 13 by the applied voltage. As a result, the piezoelectric element 13 presses the electromagnetic wave suppression material 12 to generate deformation therein. The piezoelectric element 13 also increases a contact pressure between the cage 31 and the electromagnetic wave suppression material 12.

Even if the communication module 10a is repeatedly inserted into/extracted from the chassis over years, this process prevents contact between the electromagnetic wave suppression material 12 and the cage 31 from being degraded due to plastic deformation. That is, a contact pressure between the electromagnetic wave suppression material 12 and the cage 31 may be prevented from being reduced, and therefore, radiation of electromagnetic waves may always be suppressed.

Next, a configuration and operations in the case where the communication module 10a is applied to an optical module will be described in detail. Suppose that an EMI finger is used as an electromagnetic wave suppression material. An outline of the optical module will be first described.

Figure 3:
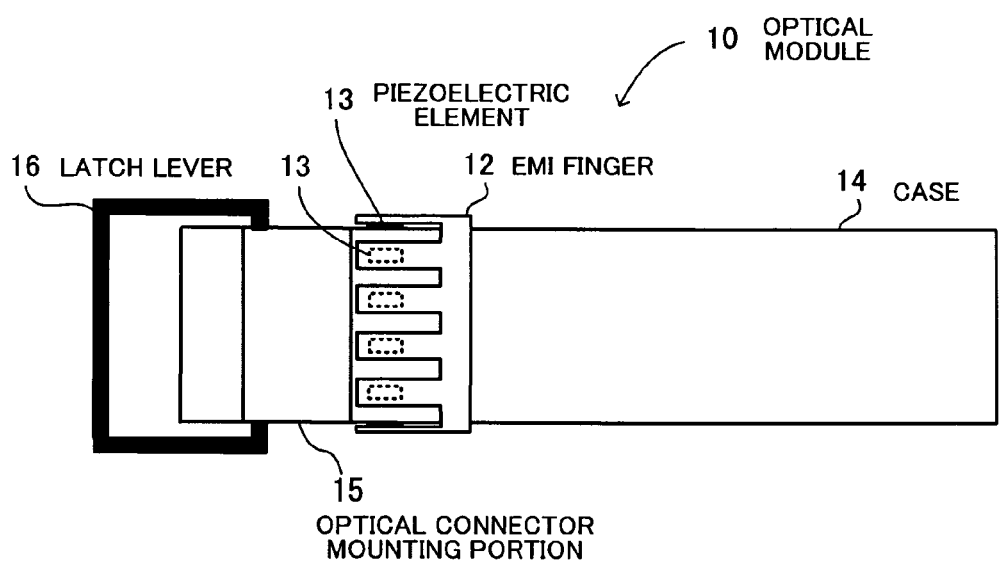
FIG. 3 illustrates the optical module having the EMI finger wound thereon.

FIGS. 2 and 3 illustrate an optical module having an EMI finger wound thereon. FIG. 3 is a view of an optical module viewed from an A direction of FIG. 2. The illustrated optical module 10 includes the printed circuit board 20, the case 14 that covers it, an optical connector mounting portion 15, and a latch lever (insertion/extraction lever) 16.

Examples of the optical module 10 include a small form-factor pluggable (SFP) type MSA optical module that performs optical communication of 2.5 Gbps or a 10 Gbps small form-factor pluggable (XFP) type MSA optical module that performs optical communication of 10 Gbps.

In addition to the controller 21, on the printed circuit board 20, although illustration is not made, components related to optical communication control, such as a laser diode that emits signal light or a photodiode that receives signal light and converts it into an electric signal, are mounted.

Further, the latch lever 16 is a component that is provided on a side surface of the optical connector mounting portion 15 (or case 14) and is used for inserting/extracting the optical module 10 into/from the chassis.

The EMI finger 12 being a metallic spring material is wound around and fixed to the case 14. Further, the piezoelectric element 13 is caused to function as an actuator (actuator: substance that generates motive energy). For example, a piezo-type piezoelectric element 13 is disposed in each elastic finger of the EMI finger 12. In addition, although illustration is not made, wiring lines for applying a voltage are routed to each piezoelectric element 13.

FIG. 4 illustrates a state in which the optical module 10 is inserted into the chassis. When inserted into the chassis, the optical module 10 is inserted into the cage 31 provided on the chassis. At this time, a connector of the printed circuit board 20 is engaged with a socket (electrical connector socket) 32 provided on the cage 31. When the optical module 10 performs optical transmission and reception, an optical connector C connected to an optical fiber f is inserted into the optical connector mounting portion 15.

When the latch lever 16 is operated upward (the latch lever 16 is retained in the holding state) and the optical module 10 is inserted into the cage 31, the optical module 10 is fixed to the cage 31, so as not to drop out of the cage 31.

Figure 5A:
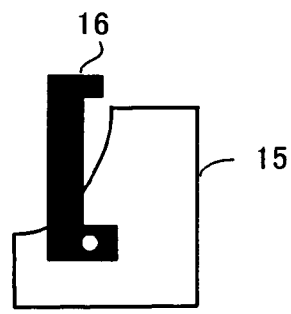
FIG. 5 illustrates an operating position of a latch lever at the time of inserting or extracting the optical module.
Figure 5B:
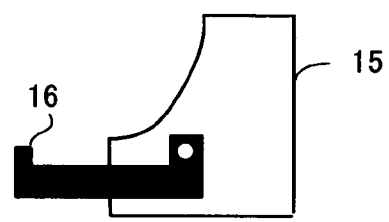

On the other hand, to extract the optical module 10 from the cage 31, the latch lever 16 is turned downward (the latch lever 16 is retained in the releasing state). Further, FIG. 5 illustrates an operating position of the latch lever 16 at the time of inserting/extracting the optical module 10 into/from the chassis.

Figure 6:
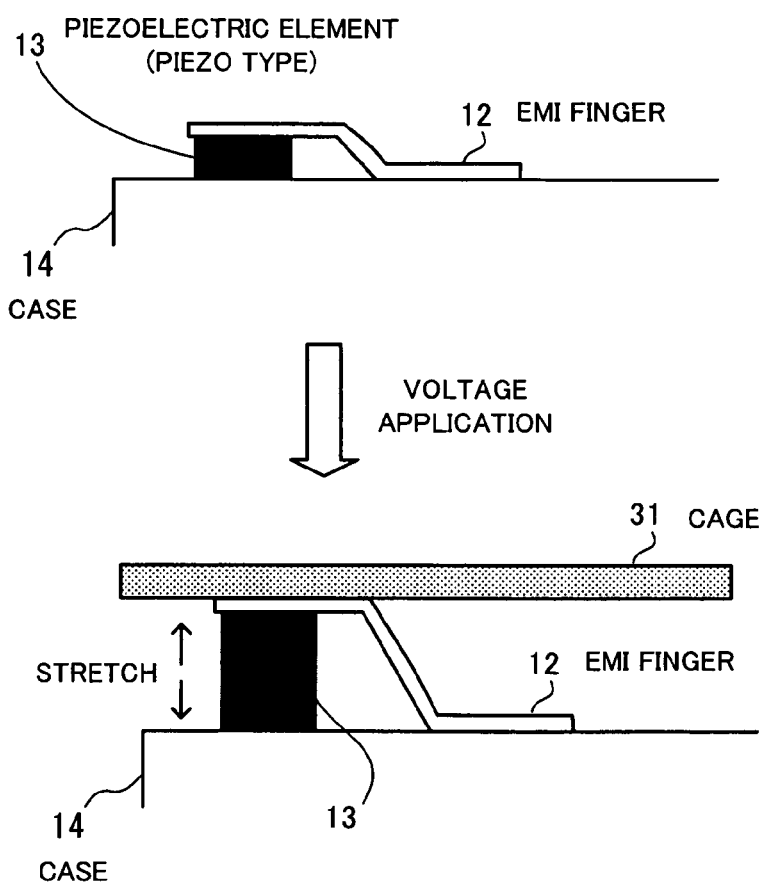
FIG. 6 illustrates an appearance in which a distortion is generated in the EMI finger by a piezo-type piezoelectric element.

FIG. 6 illustrates an appearance in which a distortion is generated in the EMI finger 12 by the piezo-type piezoelectric element. When the optical module 10 is inserted into the chassis, a voltage is applied to the piezo-type piezoelectric element 13 provided between the case 14 and the EMI finger 12. The piezoelectric element 13 is then stretched in the vertical direction, and elevates the EMI finger 12 upward. This process permits a deformation action of the EMI finger 12 to increase a contact pressure between the cage 31 and the EMI finger 12.

Figure 7:
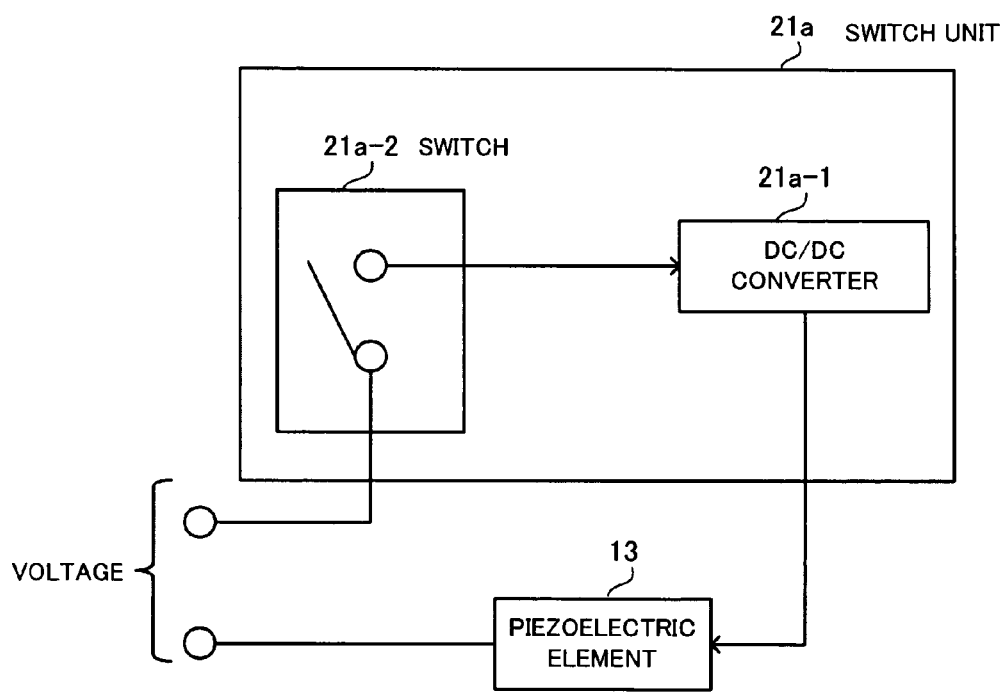
FIG. 7 illustrates one example of a mechanism in which a voltage is applied to the piezoelectric element.

A mechanism at the time when a voltage is applied to the piezoelectric element 13 will be described below. FIG. 7 illustrates one example of the mechanism in which a voltage is applied to the piezoelectric element 13. A switch unit 21a is included in the controller 21, and the switch unit 21a includes a DC/DC converter 21a-1 and a switch 21a-2.

The DC/DC converter 21a-1 converts a direct-current voltage necessary for various electronic components mounted on the printed circuit board 20 into a direct-current voltage for driving the piezoelectric element 13. For example, the DC/DC converter 21a-1 converts a direct-current voltage 3.3 volts necessary for various electronic components mounted on the printed circuit board 20 into a direct-current voltage 50 volts for stretching the piezoelectric element 13.

The switch 21a-2 performs a switching operation of the applied voltage in conjunction with opening and closing operations of the latch lever 16. When the latch lever 16 is retained in the holding state (during the insertion of the optical module 10), a switch state is ON and, for example, a voltage of 3.3 volts is applied to an input terminal of the DC/DC converter 21a-1. The DC/DC converter 21a-1 converts an input voltage into a direct-current voltage of 50 volts, and applies it to the piezoelectric element 13.

When the latch lever 16 is retained in the releasing state (during the extraction of the optical module 10), a switch state is OFF. The switch 21a-2 stops applying a voltage to an input terminal of the DC/DC converter 21a-1, which in turn stops supplying a voltage to the piezoelectric element 13.

As can be seen from the above discussion, the communication module 10 has a configuration in which the latch lever 16 operates in conjunction with the voltage switching to the piezoelectric element 13. When the latch lever 16 is retained in the holding state at the time of inserting the optical module 10 into the cage 31, the switch 21a-2 turns ON, and applies a voltage to the piezoelectric element 13. The applied voltage stretches the piezoelectric element 13, which presses the EMI finger 12 to generate a distortion and increase the contact pressure between the EMI finger 12 and the cage 31.

This process permits a deformation action of the EMI finger 12 to prevent the contact pressure to the cage 31 from being reduced due to plastic deformation, and always provide an improved effect of the EMI suppression even if insertion and extraction of the optical module 10 are repeated.

When the latch lever 16 is retained in the releasing state at the time of extracting the optical module 10 from the cage 31, the switch 21a-2 is turned OFF, and stops applying a voltage to the piezoelectric element 13. As a result, the piezoelectric element 13 is not stretched, and fails to apply pressure to the EMI finger 12. Therefore, the contact pressure between the EMI finger 12 and the cage 31 is reduced, and the optical module 10 can be easily extracted from the cage 31.

Figure 8:
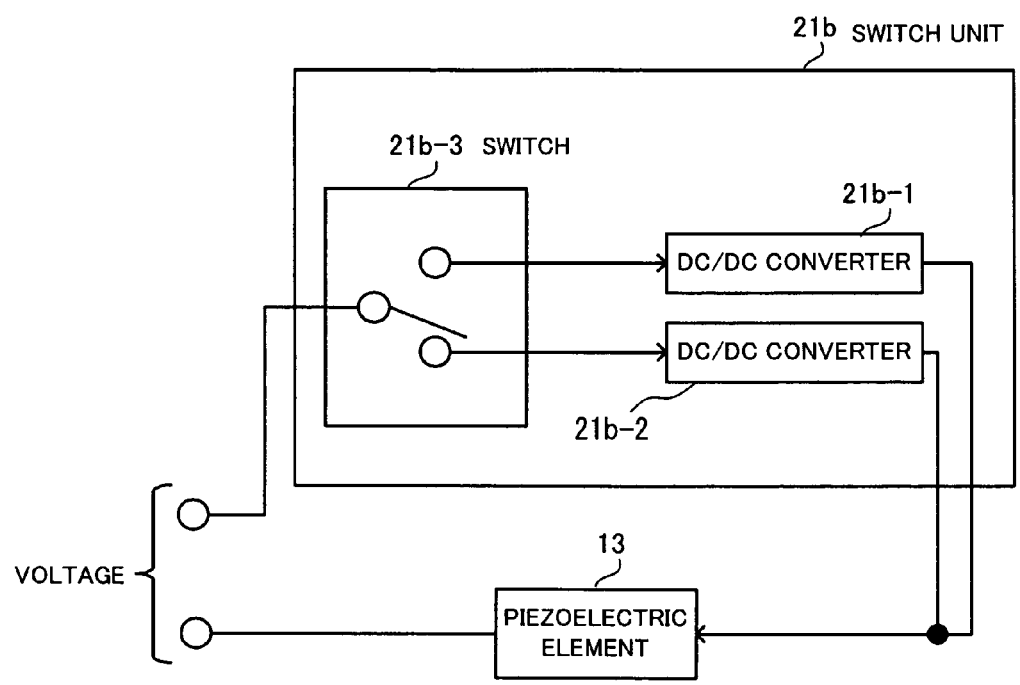
FIG. 8 illustrates one example of a mechanism in which a voltage is applied to the piezoelectric element.

A mechanism in the case where during the extraction of the optical module 10 the switch unit 21b applies a reverse voltage to the piezoelectric element 13 so that the optical module 10 is easy to be extracted will be described below. FIG. 8 illustrates one example of a mechanism in which a voltage is applied to the piezoelectric element 13. The switch unit 21b is included in the controller 21. Further, the switch unit 21b includes the DC/DC converters 21b-1 and 21b-2, and the switch 21b-3.

The DC/DC converters 21b-1 and 21b-2 convert a direct-current voltage necessary for various electronic components mounted on the printed circuit board 20 into a direct-current voltage for driving the piezoelectric element 13. Here, the DC/DC converter 21b-1 supplies a first voltage (set to a positive voltage) for stretching the piezoelectric element 13, and the DC/DC converter 21b-2 supplies a second voltage (set to a negative voltage) for reducing the piezoelectric element 13.

For example, the DC/DC converter 21b-1 converts a direct-current voltage 3.3 volts necessary for electronic components mounted on the printed circuit board 20 into a direct-current voltage +50 volts for stretching the piezoelectric element 13. On the other hand, the DC/DC converter 21b-2 converts a direct-current voltage 3.3 volts necessary for electronic components mounted on the printed circuit board 20 into a direct-current voltage −50 volts for reducing the piezoelectric element 13.

The switch 21b-3 performs a switching operation in conjunction with the opening and closing operations of the latch lever 16. When the latch lever 16 is retained in the holding state (during the insertion of the optical module 10), the switch 21b-3 performs a switching operation so as to apply a positive voltage to the piezoelectric element 13. As a result, the DC/DC converter 21b-1 applies a positive voltage to the piezoelectric element 13.

On the other hand, when the latch lever 16 is retained in the releasing state (during the extraction of the optical module 10), the switch 21b-3 performs a switching operation so as to apply a negative voltage to the piezoelectric element 13. As a result, the DC/DC converter 21b-2 applies a negative voltage to the piezoelectric element 13.

As can be seen from the above discussion, when the latch lever 16 is retained in the holding state at the time of inserting the optical module 10 into the cage 31, the switch 21b-3 performs a switching operation so as to apply a positive voltage to the piezoelectric element 13. The applied voltage then stretches the piezoelectric element 13, which presses the EMI finger 12 to generate a distortion and increase the contact pressure between the EMI finger 12 and the cage 31.

On the other hand, when the latch lever 16 is retained in the releasing state at the time of extracting the optical module 10 from the cage 31, the switch 21b-3 performs a switching operation so as to apply a negative voltage to the piezoelectric element 13. The negative voltage reduces the piezoelectric element 13, which fails to press the EMI finger 12 and reduce the contact pressure between the EMI finger 12 and the cage 31. As a result, the optical module 10 can be easily extracted from the cage 31 by using the switch unit 21b having a configuration illustrated in FIG. 8, as compared with a case in which the optical module 10 is extracted by using the switch unit 21a having a configuration illustrated in FIG. 7.

Figure 9:
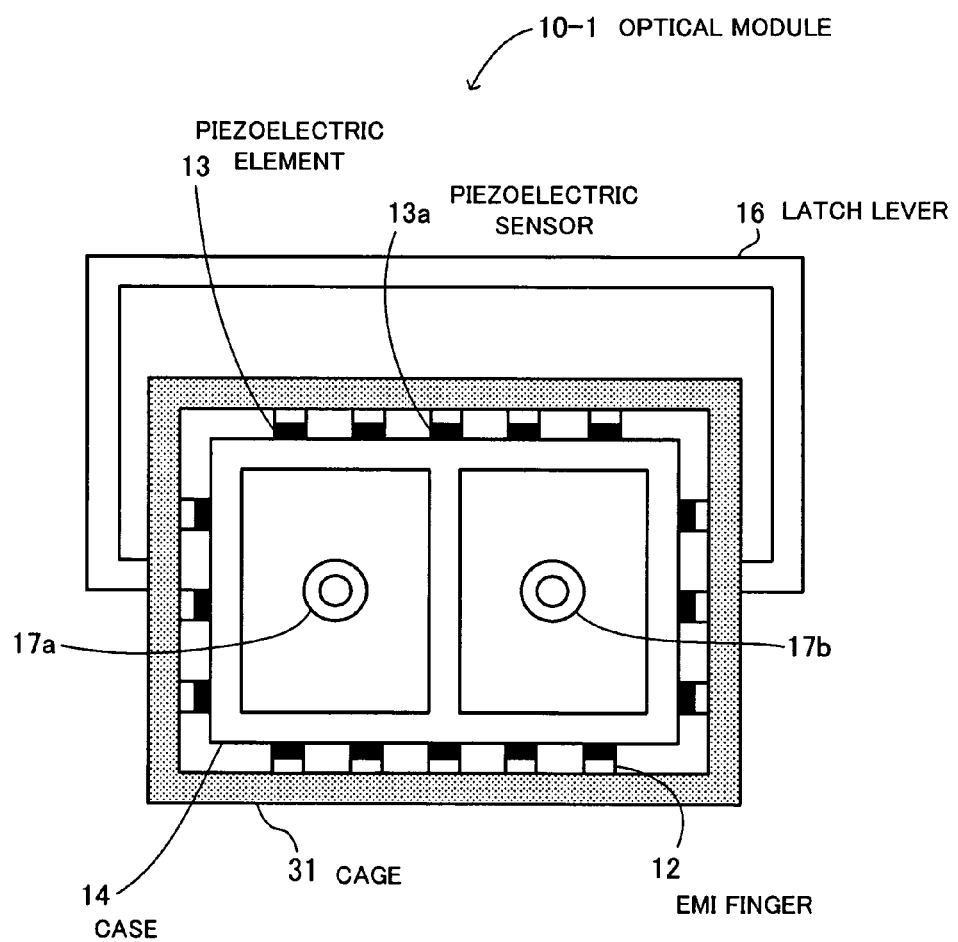
FIG. 9 illustrates the optical module that monitors a pressurized state.

An optical module that monitors a pressurized state through the piezoelectric element 13 and applies a constant pressure to the EMI finger 12 will be described below. FIG. 9 illustrates an optical module that monitors a pressurized state. FIG. 9 is a diagram viewed from a plug-in mouth of an optical connector, and illustrates an optical module 10-1 of two-core type as one example (including two sockets of the optical connector: one optical connector socket 17a being for a transmission output side of signal light and the other optical connector socket 17b being for a reception input side of signal light).

Around the case 14 of the optical module 10-1, two or more piezoelectric elements 13 are provided and located between the case 14 and the EMI fingers 12. Here, an arbitrary number of piezoelectric elements 13 are used as a pressure sensor from among the two or more piezoelectric elements 13. In this example, the piezoelectric element 13a (corresponding to a second piezoelectric element) is used as a pressure sensor.

The other piezoelectric elements 13 (corresponding to a first piezoelectric element) are used as an actuator that applies pressure to the EMI finger 12 as described above. For providing a comprehensible explanation, the piezoelectric element 13a is called as a piezoelectric sensor 13a.

Figure 10:
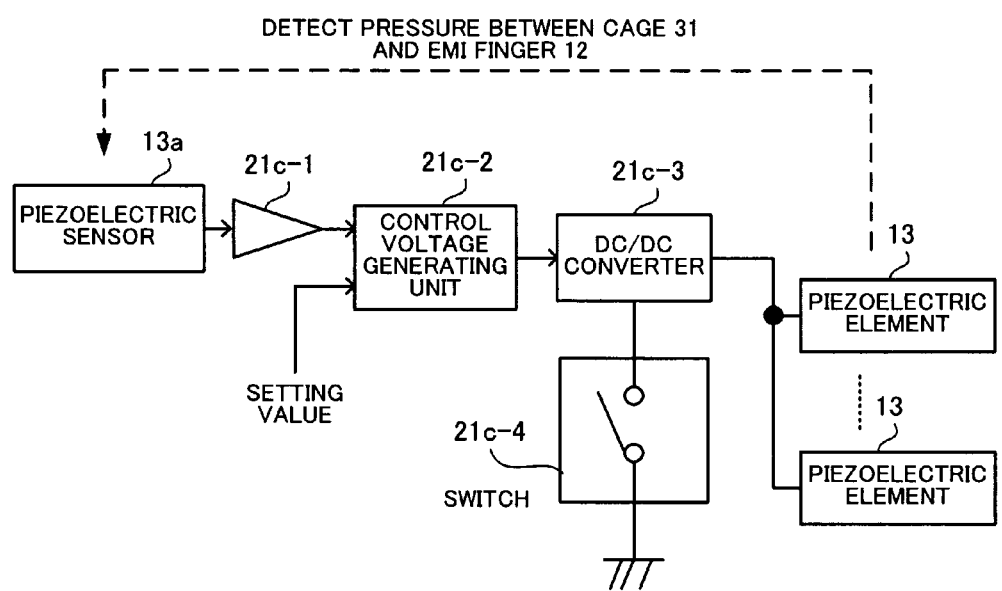
FIG. 10 illustrates a mechanism that monitors the pressurized state.

FIG. 10 illustrates a mechanism that monitors a pressurized state. An amplifier 21c-1, a control voltage generating unit 21c-2, a DC/DC converter 21c-3, and a switch 21c-4 are included in the controller 21.

The piezoelectric sensor 13a detects a pressure applied thereto, and supplies an electrical signal (pressure detection signal) according to a detected pressure to the amplifier 21c-1. The amplifier 21c-1 amplifies a pressure detection signal produced from the piezoelectric sensor 13a. The control voltage generating unit 21c-2 calculates a difference value between two supplied signals and supplies a control voltage according to the difference value to the DC/DC converter 21c-3.

The DC/DC converter 21c-3 converts a direct-current voltage necessary for various electronic components mounted on the printed circuit board 20 into a direct-current voltage for driving the piezoelectric element 13. The switch 21c-4 performs a switching operation in conjunction with the opening and closing operations of the latch lever 16. When the latch lever 16 is retained in the holding state (during the insertion of the optical module 10), the switch state is ON. As a result, the switch 21c-4 connects a power supply terminal of the DC/DC converter 21c-3 to the ground, and drives the DC/DC converter 21c-3.

On the other hand, when the latch lever 16 is retained in the releasing state (during the extraction of the optical module 10), the switch state is OFF. The switch 21c-4 releases the power supply terminal of the DC/DC converter 21c-3 from the ground, and stops driving the DC/DC converter 21c-3.

Figure 11:
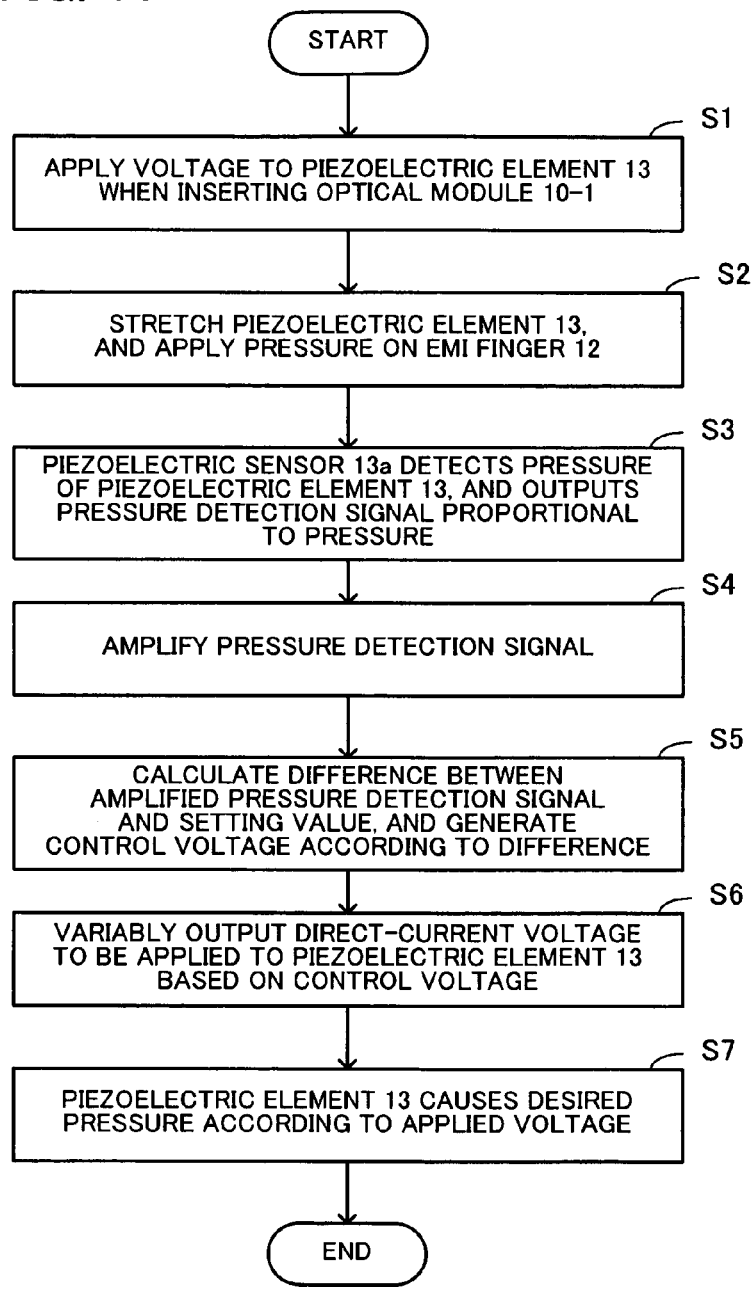
FIG. 11 illustrates an operation flowchart.

FIG. 11 illustrates an operation flowchart. FIG. 11 illustrates operations of the mechanism illustrated in FIG. 10.

[S1] When the optical module 10-1 is inserted into the cage 31 and the latch lever 16 is retained in the holding state, the switch 21c-4 turns ON, and drives the DC/DC converter 21c-3. The DC/DC converter 21c-3 then applies a predetermined voltage to the piezoelectric element 13.

[S2] The piezoelectric element 13 is stretched by the applied voltage, and generates a mechanical distortion in the EMI finger 12. The piezoelectric element elevates the EMI finger 12 toward the cage 31 and applies pressure to the EMI finger 12.

[S3] The piezoelectric sensor 13a detects a pressure generated by the piezoelectric element 13, and supplies a pressure detection signal proportional to the detected pressure to the amplifier 21c-1.

[S4] The amplifier 21c-1 amplifies a weak pressure detection signal produced from the piezoelectric sensor 13a.

[S5] The control voltage generating unit 21c-2 calculates a difference value between the amplified pressure detection signal and the setting value, and generates a control voltage based on the difference value.

Here, the contact pressure between the EMI finger 12 and the cage 31 needs to be set to an appropriate value so as to prevent excess and shortage. When applying pressure to the EMI finger 12, the piezoelectric element 13 needs to elevate the EMI finger 12 by an appropriate pressure.

For this purpose, a desired pressure to be generated by the piezoelectric element 13 is previously determined. Further, a value of an electrical signal corresponding to the above-described pressure is previously stored as a setting value (setting value is registered in a memory of the controller 21).

[S6] The DC/DC converter 21c-3 variably supplies to the piezoelectric element 13 a direct-current voltage according to a control voltage produced from the control voltage generating unit 21c-2, thereby applying the direct-current voltage thereto.

[S7] The piezoelectric element 13 generates a desired pressure according to the applied voltage (the description will not be repeated on operations of the extraction of the optical module).

As described above, the optical module 10-1 has a configuration in which a feedback control is performed so that one piezoelectric element may be used as the piezoelectric sensor 13a from among two or more piezoelectric elements 13, a pressurized state of the piezoelectric elements 13 may be always monitored by using the piezoelectric sensor 13a, and a pressure of the piezoelectric element 13 may become a desired pressure.

This permits the optical module 10-1 to maintain a constant pressure. Note that in the above description, one piezoelectric sensor is used; further, an optional number of piezoelectric sensors may be used (for example, piezoelectric sensors may be provided at certain intervals, or a piezoelectric sensor may be provided in each plane of the cage 31 on which the piezoelectric element 13 applies pressure).

Figure 12:
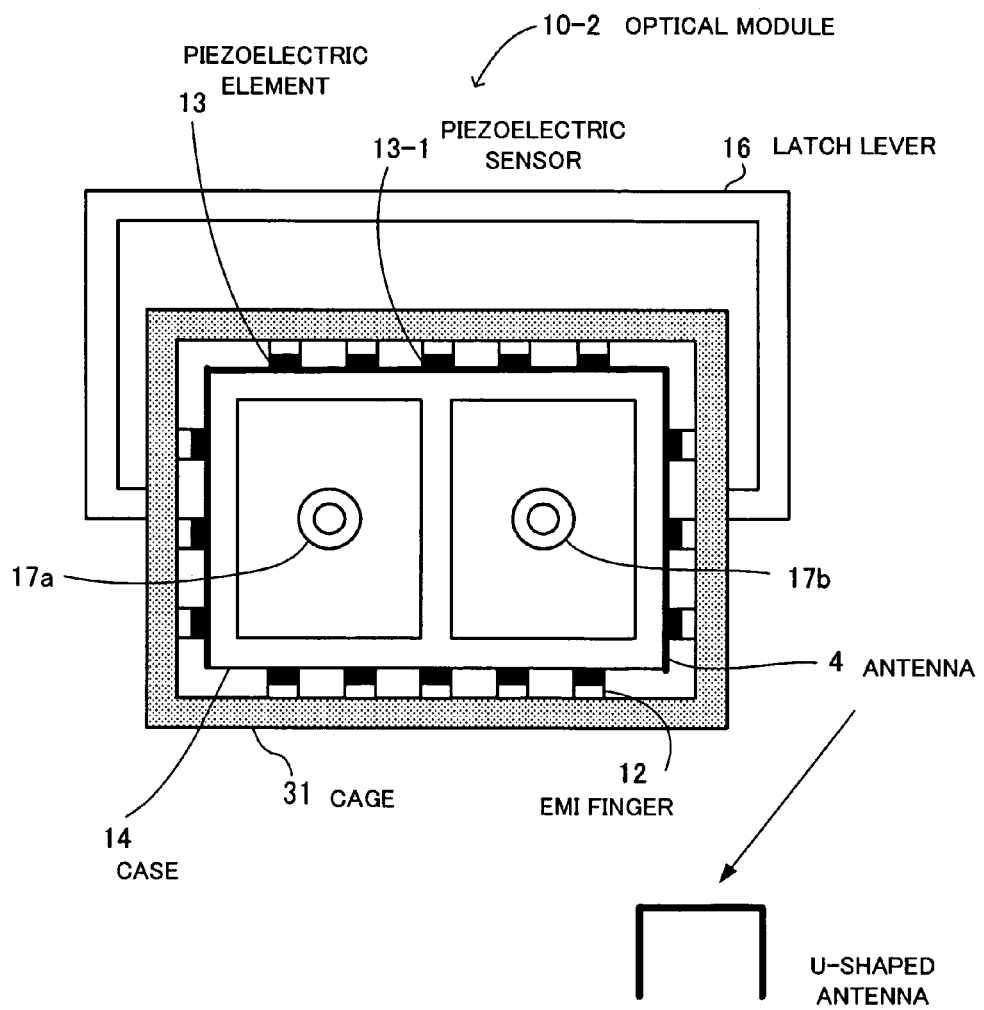
FIG. 12 illustrates the optical module that monitors a radiation level of an electromagnetic wave.

An optical module that monitors intensity of an electromagnetic wave by using an antenna and applies a constant pressure to the EMI finger 12 will be described below. FIG. 12 illustrates the optical module that monitors a radiation level of an electromagnetic wave. FIG. 12 is a diagram viewed from a plug-in mouth of an optical connector, and illustrates the optical module of two-core type.

Around the case 14 of the optical module 10-2, an antenna 4 is provided. As the antenna 4, for example, a U-shaped film antenna is used. Further, on the case 14, the above-described piezoelectric elements 13 are provided and located between the case 14 and the EMI finger 12.

Figure 13:
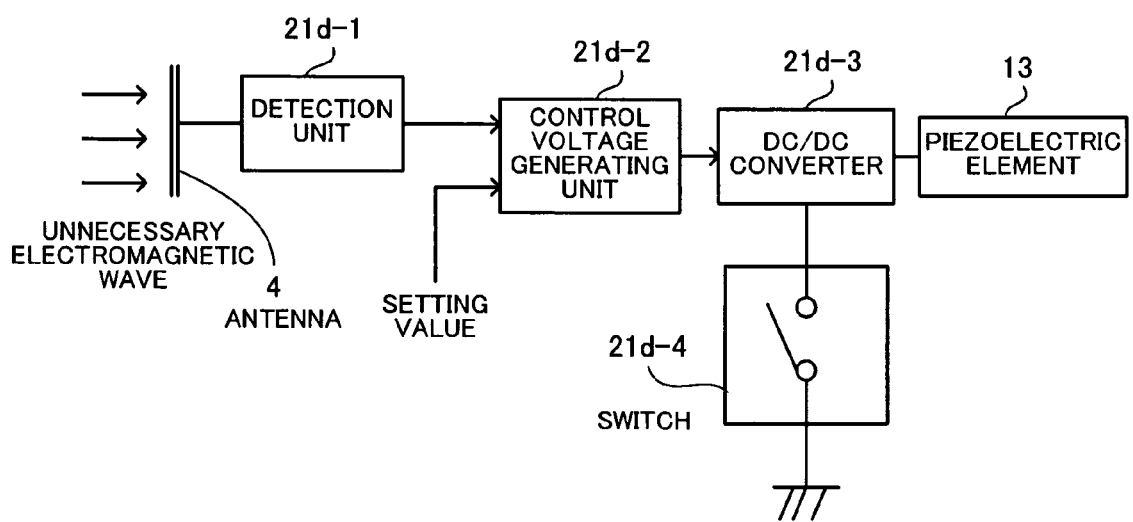
FIG. 13 illustrates the mechanism that monitors the radiation level of an electromagnetic wave.

FIG. 13 illustrates a mechanism that monitors a radiation level of an electromagnetic wave. A detection unit 21d-1, a control voltage generating unit 21d-2, a DC/DC converter 21d-3, and a switch 21d-4 are included in the controller 21.

The antenna 4 absorbs and detects an electromagnetic wave. The detection unit 21d-1 detects the electromagnetic wave detected by the antenna 4, and supplies an electrical signal (electromagnetic wave detection signal) proportional to the intensity of the electromagnetic wave to the control voltage generating unit 21d-2. The control voltage generating unit 21d-2 calculates a difference value between two supplied signals, and supplies a control voltage according to the difference value to the DC/DC converter 21d-3.

The DC/DC converter 21d-3 converts one direct-current voltage necessary for various electronic components mounted on the printed circuit board 20 into another direct-current voltage for driving the piezoelectric element 13. The switch 21d-4 performs a switching operation in conjunction with the opening and closing operations of the latch lever 16. When the latch lever 16 is retained in the holding state (during the insertion of the optical module 10), the switch state is ON. As a result, the switch 21d-4 connects a power supply terminal of the DC/DC converter 21d-3 to the ground, and drives the DC/DC converter 21d-3.

On the other hand, when the latch lever 16 is retained in the releasing state (during the extraction of the optical module 10), the switch state is OFF. The switch 21d-4 releases the power supply terminal of the DC/DC converter 21d-3 from the ground, and stops driving the DC/DC converter 21d-3.

Figure 14:
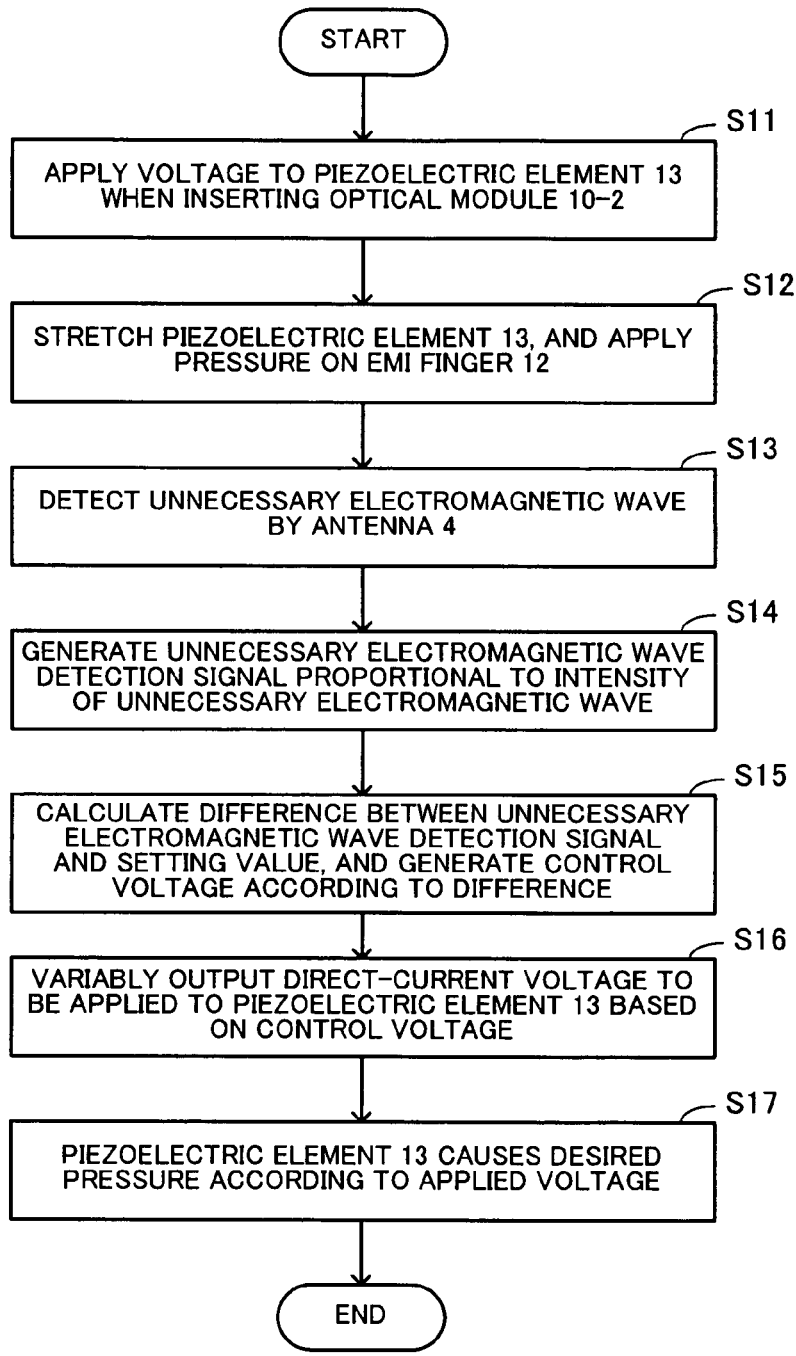
FIG. 14 illustrates an operation flowchart.

FIG. 14 illustrates an operation flowchart. FIG. 14 illustrates operations of the mechanism illustrated in FIG. 13.

[S11] When the optical module 10-2 is inserted into the cage 31 and the latch lever 16 is retained in the holding state, the switch 21d-4 turns ON, and drives the DC/DC converter 21d-3. The DC/DC converter 21d-3 then applies a predetermined voltage to the piezoelectric element 13.

[S12] The piezoelectric element 13 is stretched by the applied voltage. The piezoelectric element 13 causes a mechanical distortion in the EMI finger 12, elevates it toward the cage 31, and applies pressure thereto.

[S13] The antenna 4 absorbs and detects an electromagnetic wave radiated from a gap between the EMI finger 12 and the cage 31.

[S14] The detection unit 21d-1 generates an electromagnetic wave detection signal proportional to the intensity of the electromagnetic waves absorbed by the antenna 4.

[S15] The control voltage generating unit 21d-2 calculates a difference value between a setting value and an electromagnetic wave detection signal produced from the detection unit 21d-1, and generates a control voltage based on the difference value.

Here, when the contact pressure between the EMI finger 12 and the cage 31 is reduced, the electromagnetic waves are radiated from a gap between the cage 31 and the EMI finger 12. Therefore, the piezoelectric element 13 applies pressure to the EMI finger 12 so as to suppress radiation of the electromagnetic waves up to an appropriate level. On this occasion, the piezoelectric element 13 needs to elevate the EMI finger 12 by using an appropriate pressure.

Therefore, an allowable level value of the electromagnetic waves is previously determined. Further, an electrical signal value corresponding to this level value is previously held as the setting value (setting value is registered in, for example, a memory of the controller 21).

[S16] The DC/DC converter 21d-3 variably supplies to the piezoelectric element 13 a direct-current voltage according to a control voltage from the control-current voltage generating unit 21d-2, thereby applying the direct-current voltage to the piezoelectric element 13.

[S17] The piezoelectric element 13 causes a desired pressure according to the applied voltage (the description will not be repeated on operations during the extraction of the optical module).

As described above, the optical module 10-2 has a configuration in which feedback control for changing a pressure to the piezoelectric element 13 is performed so that a radiation level of the electromagnetic waves is monitored by using the antenna 4 and an electromagnetic wave radiation level becomes an allowable level value.

This process permits the optical module 10-2 to hold a constant radiation level of the electromagnetic waves. Therefore, the optical module 10-2 can hold a constant pressure, and further exert an effect of the EMI suppression. Note that as long as the antenna 4 appropriately can absorb and detect electromagnetic waves, a shape and mounting position thereof are arbitrarily determined.

The modification embodiment will be described below. The above-described optical module 10-2 has a configuration in which the piezo-type piezoelectric elements 13 are provided on the case 14. As compared with the optical module 10-2 according to the present embodiment, in the modification embodiment, an optical module has a configuration in which bimorph piezoelectric elements are used and provided on the EMI finger 12 side.

Figure 15:
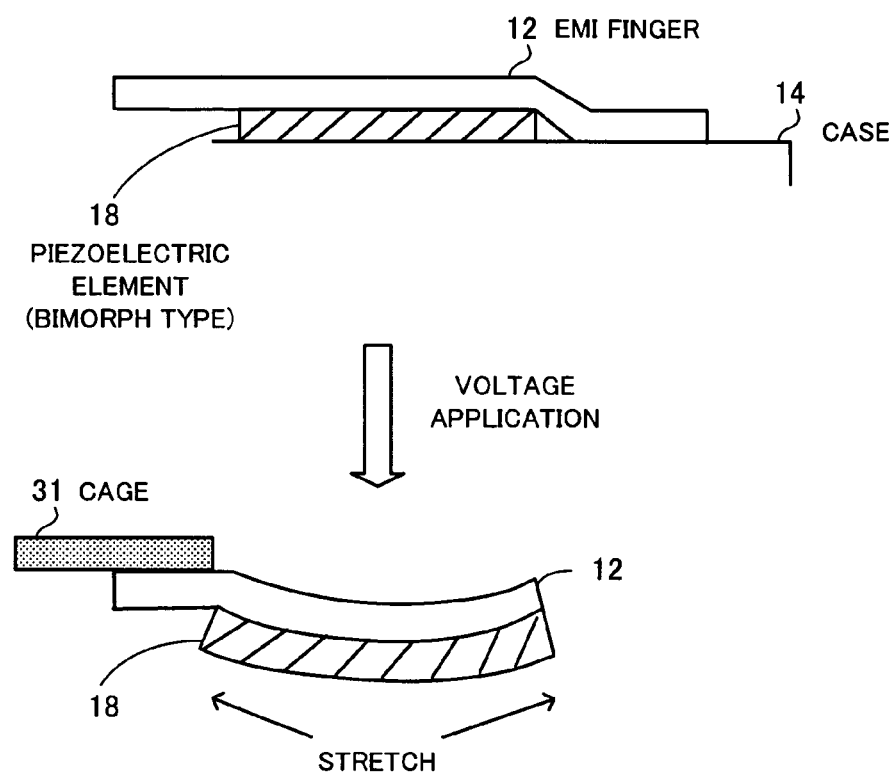
FIG. 15 illustrates a state in which a bimorph-type piezoelectric element is stuck on the EMI finger.
Figure 16:
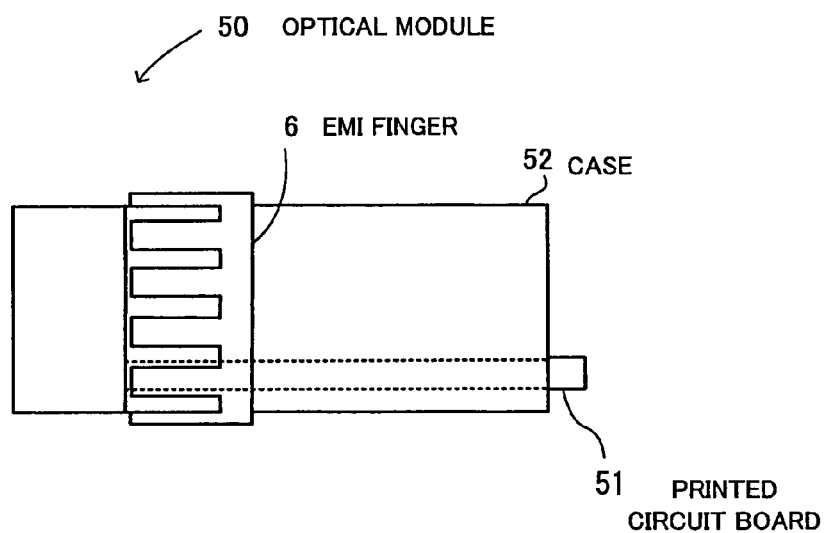
FIG. 16 illustrates the optical module having the EMI finger wound thereon.
Figure 17:
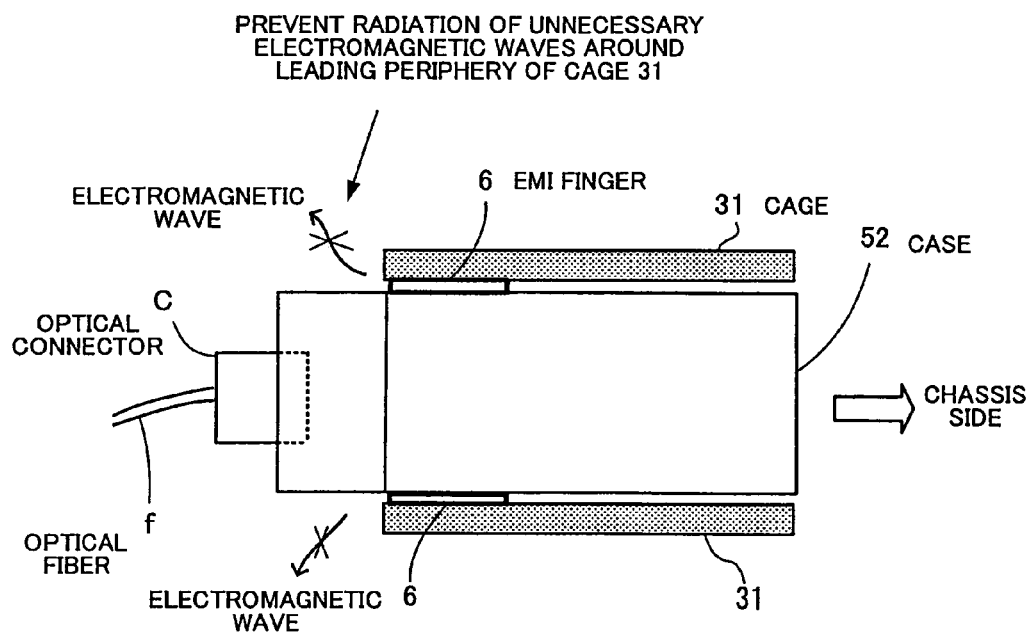
FIG. 17 illustrates a state in which the optical module is inserted into the chassis.

FIG. 15 illustrates a state in which the bimorph piezoelectric element is stuck on the EMI finger 12. The bimorph piezoelectric element 18 is stuck on a lower surface of a finger as an elastic body of the EMI finger 12 (mounted by metal deposition or a fixing process of a metallic foil), and is located between the case 14 and the EMI finger 12.

Under the above-described state, when a voltage is applied to the piezoelectric element 18, it is stretched. Therefore, the EMI finger 12 is curved into a projection toward the lower case 14, and applies upward pressure to the cage 31.

Accordingly, in the above-described optical modules 10, 10-1, and 10-2, the bimorph piezoelectric element 18 causes a mechanical distortion in the EMI finger 12 so as to elevate the EMI finger 12 toward the cage 31 for pressurization, and increase the contact pressure between the EMI finger 12 and the cage 31. In this connection, to elevate the EMI finger by reducing the bimorph piezoelectric element using the applied voltage, the bimorph piezoelectric element may be stuck on an upper surface of the EMI finger.

As can be seen from various embodiments discussed above, the proposed communication module can prevent contact deterioration of an electromagnetic wave suppression member, and suppress radiation of electromagnetic waves.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions and alterations could be made hereto without departing from the spirit and scope of the invention.

What is claimed is:

1. A communication module comprising:
    a case to cover an internal component of the module capable of being inserted into/extracted from a chassis;
    an electromagnetic wave suppression material provided on a surface of the case to contact with a cage to suppress radiation of an electromagnetic wave at the time of inserting the module into the cage being a module insertion portion of the chassis;
    a piezoelectric element provided between the case and the electromagnetic wave suppression material; and
    a controller to perform voltage control to the piezoelectric element,
    wherein when the module is inserted into the cage, the controller controls the piezoelectric element to apply pressure to the electromagnetic wave suppression material to increase contact pressure between the cage and the electromagnetic wave suppression material.

2. The communication module according to claim 1, wherein:
    an insertion/extraction lever used at the time of inserting/extracting the module into/from the chassis is provided;
    the controller includes a switch unit that performs a switching operation of voltage according to an opening and closing state of the insertion/extraction lever;
    when the insertion/extraction lever is retained in a holding state at the time of inserting the module into the cage, the switch unit is turned ON and applies the voltage to the piezoelectric element; and
    when the insertion/extraction lever is retained in a releasing state at the time of extracting the module from the cage, the switch unit is turned OFF and stops applying the voltage to the piezoelectric element.

3. The communication module according to claim 1, wherein:
- an insertion/extraction lever used at the time of inserting/extracting the module into/from the chassis is provided;
- the controller includes a switch unit that performs a switching operation between a first voltage and a second voltage according to an opening/closing state of the insertion/extraction lever;
- when the insertion/extraction lever is retained in the holding state at the time of inserting the module into the cage, the switch unit performs a switching operation to apply the first voltage to the piezoelectric element to stretch the piezoelectric element by the first voltage; and
- when the insertion/extraction lever is retained in the releasing state at the time of extracting the module from the cage, the switch unit performs a switching operation to apply the second voltage to the piezoelectric element to reduce the piezoelectric element by the second voltage.

4. A communication module comprising:
- a case to cover an internal component of the module capable of being inserted into/extracted from a chassis;
- an electromagnetic wave suppression material provided on a surface of the case to contact with a cage to suppress radiation of an electromagnetic wave at the time of inserting the module into the cage being a module insertion portion of the chassis;
- a first piezoelectric element provided between the case and the electromagnetic wave suppression material;
- a second piezoelectric element to output an electrical signal according to applied pressure; and
- a controller to perform voltage control to the first piezoelectric element, wherein:
- the second piezoelectric element detects pressure at the time of inserting the module into the cage, and outputs the electrical signal according to the detected pressure; and
- the controller controls the first piezoelectric element to apply pressure to the electromagnetic wave suppression material and hold a constant contact pressure between the electromagnetic wave suppression material and the cage so that the electrical signal has a predetermined value.

5. The communication module according to claim 4, wherein:
- an insertion/extraction lever used at the time of inserting/extracting the module into/from the chassis is provided;
- the controller includes a switch unit that performs a switching operation of the voltage according to an opening/closing state of the insertion/extraction lever;
- when the insertion/extraction lever is retained in a holding state at the time of inserting the module into the cage, the switch unit is turned ON and applies the voltage to the first piezoelectric element; and
- when the insertion/extraction lever is retained in a releasing state at the time of extracting the module from the cage, the switch unit is turned OFF and stops applying the voltage to the first piezoelectric element.

* * * * *